United States Patent
Choi et al.

(10) Patent No.: US 8,939,595 B2
(45) Date of Patent: Jan. 27, 2015

(54) BACKLIGHT ASSEMBLY AND DISPLAY DEVICE INCLUDING THE SAME

(71) Applicant: G&CS Co., Ltd, Seoul (KR)

(72) Inventors: Suk-Hong Choi, Seoul (KR); Sang-Hee Park, Bucheon-si (KR)

(73) Assignee: G&CS Co., Ltd (KR)

( * ) Notice: Subject to any disclaimer, the term of this patent is extended or adjusted under 35 U.S.C. 154(b) by 0 days.

(21) Appl. No.: 14/166,847

(22) Filed: Jan. 28, 2014

(65) Prior Publication Data

US 2014/0146524 A1 May 29, 2014

Related U.S. Application Data

(62) Division of application No. 13/655,773, filed on Oct. 19, 2012, now Pat. No. 8,646,931.

(30) Foreign Application Priority Data

Jan. 18, 2012 (KR) .................. 10-2012-0005604

(51) Int. Cl.
  *F21V 29/00* (2006.01)
  *G02F 1/1335* (2006.01)
  *F21V 8/00* (2006.01)
  *G02F 1/1333* (2006.01)

(52) U.S. Cl.
  CPC .......... *F21V 29/24* (2013.01); *G02F 1/133615* (2013.01); *G02B 6/0085* (2013.01); *G02B 6/009* (2013.01); *G02F 2001/133317* (2013.01); *G02F 2001/133628* (2013.01); *H01L 2924/0002* (2013.01)
  USPC .......................... 362/97.1; 362/613; 362/97.3

(58) Field of Classification Search
  CPC ................ F21V 129/24; G02B 6/0085; G02F 1/133615
  USPC .................. 362/97.1–97.4, 613, 612, 249.02; 349/58, 61, 62, 65
  See application file for complete search history.

(56) References Cited

U.S. PATENT DOCUMENTS

| | | | |
|---|---|---|---|
| 7,452,121 B2 | 11/2008 | Cho et al. | |
| 7,481,567 B2 | 1/2009 | Cho et al. | |
| 8,646,931 B2 * | 2/2014 | Choi et al. | 362/97.1 |
| 2009/0267526 A1 | 10/2009 | Sung et al. | |
| 2013/0182412 A1 * | 7/2013 | Choi et al. | 362/97.1 |

FOREIGN PATENT DOCUMENTS

| | | |
|---|---|---|
| JP | 3135971 | 2/2001 |
| JP | 2011243554 A | 12/2011 |
| KR | 20080024256 A | 3/2008 |
| KR | 101034046 | 5/2011 |

* cited by examiner

*Primary Examiner* — Anabel Ton

(57) ABSTRACT

This invention relates to a backlight assembly having improved heat dissipation performance and a simplified structure and to a display device including the same. The backlight assembly includes a light source unit for generating light, a housing for accommodating the light source unit and having an aperture, a middle frame coupled to the housing and receiving the light source unit, and an LED fixing frame which is adjacent to the light source unit and is coupled to the housing and at least a part of which is exposed through the aperture.

12 Claims, 12 Drawing Sheets

BACKLIGHT ASSEMBLY AND DISPLAY DEVICE INCLUDING THE SAME

BACKGROUND OF THE INVENTION

1. Field of the Invention

The present invention relates to a backlight assembly and a display device including the same, and more particularly to a backlight assembly in which heat dissipation performance is enhanced and its structure is simplified, and to a display device including the same.

2. Description of the Related Art

Recently, in order to reduce the use of energy and decrease the greenhouse gas to promote low-carbon green growth all over the world, light emitting diodes (LEDs) which are regarded as a low-pollution eco-friendly product are being increasingly used as a backlight in a variety of liquid crystal displays.

A display device (e.g. a liquid crystal display (LCD)) is the type of flat panel display (FPD) that is the most widely used these days, and is configured such that a liquid crystal layer is interposed between two substrates having electrodes, so that liquid crystal molecules of the liquid crystal layer are rearranged upon applying voltage to the electrodes, thereby adjusting the amount of transmitted light.

A display device which is a passive light emitting device includes a display panel for displaying an image and a backlight assembly which supplies light to the display panel. The backlight assembly is classified as a direct type or an edge type depending on the position of a light source.

The demand for display devices which are light, slim, short and small and are improved in color reproducibility is recently increasing. Accordingly, research into using a point light source such as an LED (Light Emitted Diode) as a light source provided in the backlight assembly is ongoing. In particular, to increase performance of the display device and prevent the light source from deteriorating, enhancement of heat dissipation performance is essential.

Hence, in consideration of high efficiency, high integration, high functionality and the fabrication of light, slim, short and small devices in the industry, LEDs are designed in the form of a part, a module, a set, etc. When designers of respective fields make their designs so that they satisfy the above mentioned technical trends, there may occur cases where more heat may be generated compared to that generated by conventional design techniques, undesirably causing problems of the performance of the system or the like deteriorating due to such heat. Accordingly in the related industrial fields, thorough research into efficiently solving thermal problems (i.e. heat dissipation, heat diffusion, heat dispersion, heat collection, heat transfer, etc.) of generated heat continues.

A backlight using an LED includes an LED device having high energy efficiency, a power stabilization device which stabilizes power supplied to the LED element, and a heat dissipation member which dissipates heat generated from the above two devices to the atmosphere.

When the LED which is a compound semiconductor is used at higher temperature, thermal vibration of atoms obstructs the flow of electrons, undesirably lowering illuminance. As the temperature becomes very high, diffusion occurs in the diffusion layer of the semiconductor, drastically lowering illuminance and remarkably shortening the service life.

The case where the power stabilization device is unstable creates an electrical impact on the LED, and upon AC/DC conversion of the power stabilization device, a large amount of heat is generated and thus performance of the semiconductor of the power stabilization device may deteriorate upon driving at high temperature, undesirably shortening the lifetime of the backlight for a liquid crystal display.

Also a backlight for a liquid crystal display needs to be prepared to be dust-proof and explosion-proof as well as waterproof depending on the operating environment.

Useful in a conventional LED is a heat dissipation material that is a metal having high thermal conductivity, for example, copper or aluminum. Typically it is known that copper has a thermal conductivity of 300 W/mk and aluminum has a thermal conductivity of 175 W/mk, and these metals are thermally and electrically conductive because of metal bonding. However, the heat and electricity conduction directions are isotropic because of free electrons and thermal and electrical conductivities may decrease due to thermal vibration of lattices at high temperature, and heat emitted from a heat source may dissipate only by means of isotropic heat diffusion when using a heat dissipation member made of a metal, thus forming a temperature distribution such as hot spots, undesirably resulting in deteriorated heat dissipation effects. In order to solve such problems, a heat sink of copper or aluminum having fast heat diffusion may be formed to be thick or its surface area may be increased, thus increasing the contact surface with a convective surface (air or water), or grooves may be made on the surface of the heat sink in a vertical direction. In this case, however, the heat sink has a complex shape and becomes heavy and the manufacturing process becomes complicated. Moreover, because metal resources are limited, they are expensive and their supply may not be efficient depending on the international situation, and a lot of energy is consumed upon ore smelting.

SUMMARY OF THE INVENTION

Accordingly, the present invention has been made keeping in mind the above problems encountered in the related art, and an object of the present invention is to provide a backlight assembly, which includes an expanded graphite sheet having superior heat dissipation performance, and a display device including the same.

According to an embodiment of the present invention, a backlight assembly includes a circuit board on which electronic parts corresponding to a heat source are mounted and an expanded graphite sheet positioned under the circuit board and used as a heat dissipation member for heat diffusion.

According to an embodiment of the present invention, a backlight assembly comprises a circuit board on which LEDs are provided in a predetermined pattern, a fixing frame for fixing the circuit board, and a graphite sheet disposed between the circuit board and the fixing frame, wherein the graphite sheet comprises a graphite layer having a density of 1.0~2.0 g/cm$^3$, a support film formed on at least one surface of the graphite layer, and an adhesive layer applied on at least one surface of the support film, and the graphite sheet has a thermal conductivity of 400~1900 W/mK in a horizontal direction and 3~20 W/mK in a vertical direction.

In the embodiment of the invention, the graphite layer may comprise expanded graphite and amorphous carbon particles having a particle size of 10~110 nm, and the graphite layer may comprise 5~30 wt % of the amorphous carbon particles based on the total weight of the expanded graphite and the amorphous carbon particles.

In the embodiment of the invention, the backlight *assembly* may further comprise a coupling member disposed on any one of the circuit board and the fixing frame, and a coupling groove formed on the other one of the circuit board and the fixing frame.

As such, the coupling member may include a protrusion portion, and a coupling protrusion extending from at least one side of the protrusion portion, and the coupling groove may include an insertion portion into which the coupling member is inserted so as to be connected therewith, and a coupling groove portion extending from the insertion portion in an extension direction of the circuit board so that the coupling member is connected in a sliding manner.

Also, one of the circuit board and the fixing frame may further include a depression portion at a position corresponding to the coupling member.

Also the width of the coupling protrusion may be greater than the width of the protrusion portion, and the width of the insertion portion may be greater than the width of the coupling protrusion. The protrusion portion may be equal to or less than the narrowest portion of the coupling groove portion.

In the embodiment of the invention, the backlight *assembly* may further comprise a housing for accommodating the fixing frame and having an aperture, and a part of the fixing frame is exposed to outside of the housing through the aperture.

According to another embodiment of the present invention, a backlight assembly comprises a circuit board on which light emitting diodes are provided in a predetermined pattern, a fixing frame for fixing the circuit board, and a thermally conductive adhesive layer disposed between the circuit board and the fixing frame, wherein the thermally conductive adhesive layer comprises a polymer resin composed of any one selected from among a silicone based resin, an acrylic resin and a urethane based resin, and a filler composed of any one selected from among metal oxide, metal hydroxide, metal nitride, metal carbide, a boron compound and graphite.

The acrylic resin may be a polymer resulting from copolymerizing any one (meth)acrylic acid ester based monomer selected from among butyl (meth)acrylate, hexyl (meth)acrylate, n-octyl (meth)acrylate, iso-octyl (meth)acrylate, 2-ethylhexyl (meth)acrylate, and isononyl (meth)acrylate, having a C1~12 alkyl group; and any one polar monomer copolymerizable with the monomer, selected from among carboxylic group-containing monomers including (meth)acrylic acid, maleic acid, and fumaric acid, and monomers including acrylamide, N-vinylpyrrolidone, and N-vinylcaprolactam.

The (meth)acrylic acid ester based monomer and the polar monomer may have a weight ratio of 99~80:1~20.

The graphite may be used in an amount of 3~40 wt %.

According to a further embodiment of the present invention, a display device comprises a display panel for displaying an image, a circuit board on which light emitting diodes are provided in a predetermined pattern, a fixing frame for fixing the circuit board, and a graphite sheet disposed between the circuit board and the fixing frame, wherein the graphite sheet comprises a graphite layer having a density of 1.0~2.0 g/cm$^3$, a support film formed on at least one surface of the graphite layer, and an adhesive layer applied on at least one surface of the support film, and the graphite layer comprises expanded graphite and amorphous carbon particles having a particle size of 10~110 nm, and the graphite sheet has a thermal conductivity of 400~1900 W/mK in a horizontal direction and 3~20 W/mK in a vertical direction.

According to still a further embodiment of the present invention, a display device comprises a display panel for displaying an image, a circuit board on which light emitting diodes are provided in a predetermined pattern, a fixing frame for fixing the circuit board, and a thermally conductive adhesive layer disposed between the circuit board and the fixing frame, wherein the thermally conductive adhesive layer comprises a polymer resin composed of any one selected from among a silicone based resin, an acrylic resin and a urethane based resin, and a filler composed of any one selected from among metal oxide, metal hydroxide, metal nitride, metal carbide, a boron compound and graphite.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Figure 1:
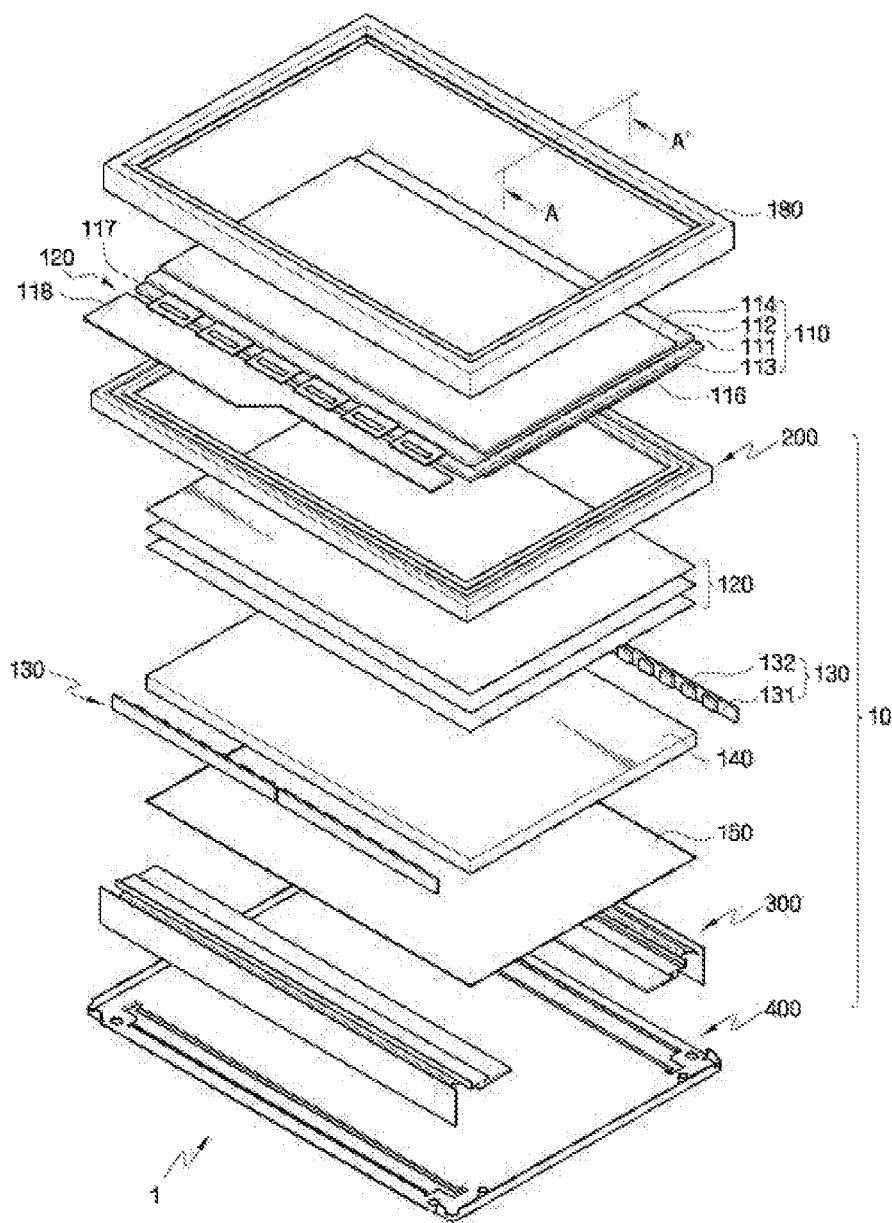
FIG. 1 is an exploded perspective view illustrating a display device according to an embodiment of the present invention.

Hereinafter, preferred embodiments of the present invention will be described in detail with reference to the attached drawings. However, the present invention is not limited to the following embodiments and may be embodied in a variety of different forms, and the present embodiments are provided so that the present teachings will be thorough and complete and will fully convey the intended concepts to those having ordinary knowledge in the art, and the present invention is merely defined by the scope of the claims. Thus, in some embodiments, known process steps, known device structures and known techniques are not specifically described in order to avoid making the interpretation of the invention unclear. Throughout the drawings, the same reference numerals refer to the same or similar components.

The spatially relative terms "below", "beneath", "lower", "above", "upper", etc., may be used herein to easily describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

The terms used herein are intended to describe the embodiments, and are not construed as limiting the invention. As used herein, a singular form includes a plural form unless specifically stated in the text. Also the term "comprises" and/or "comprising" used herein means that the mentioned component, step, operation and/or element do not exclude the presence or addition of one or more other components, steps, operations and/or elements.

Unless otherwise defined, all of the terms used herein (including technical and scientific terms) will be able to be used as meanings which may be commonly understood by those having ordinary knowledge in the art. Also the terms defined in a dictionary typically used should not be ideally or excessively interpreted unless apparently specifically defined.

In the present invention, a backlight assembly including an expanded graphite sheet as a heat dissipation member includes a printed circuit board and an expanded graphite sheet.

The printed circuit board is used to mount electronic parts corresponding to a heat source including LEDs thereon, and the expanded graphite sheet is disposed below the circuit board so that heat generated from the LEDs is diffused.

Also according to the present invention a backlight for a liquid crystal display includes a substrate for electronic parts including an expanded graphite sheet as a heat dissipation member.

Useful in the present invention, the expanded graphite sheet is formed via the following procedure.

In the present invention, natural crystalline graphite is intercalated with a mixture solution of sulfuric acid and hydrogen peroxide to form an interlayer compound which is then instantly expanded in a furnace at high temperature to make graphene, which is then rolled thus manufacturing an expanded graphite sheet.

A conventional graphite sheet is manufactured by subjecting graphite expanded to about 180~250 ml/g to roller compaction at a compaction ratio of 30% or more. The density of the sheet subjected to roller compaction is 0.8~1.25 g/cm$^3$, and may be adjusted depending on the pressure which is applied to the expanded particles and the roller, and the thickness of the sheet may be 0.1~6.0 mm. However, as the sheet becomes thicker, its density must necessarily decrease.

In the present invention, the expanded graphite sheet may be obtained by compacting graphite expanded to 250 ml/g or more, unlike conventional techniques. In the process of manufacturing the expanded graphite sheet, vibration pressing may be applied or dense amorphous nano-carbon may be added to reduce the amount of air gap (thermal conductivity of air 0.028 W/mK) that is a resistance medium.

Typically, upon roller compaction, the surface density increases more rapidly than the inner density, and thus it is difficult to discharge air from the surface or the lower surface. While air that remains behind in the sheet is discharged via both sides of the sheet which is compact rolled or in a direction opposite the direction in which the sheet is proceeding, the density of the sheet is increased. However, when the sheet becomes thick, the inner density of the sheet is remarkably lower than that of the surface thereof, making it difficult to perform heat diffusion, undesirably decreasing heat dissipation performance. To solve this problem, thin sheets may be layered. As such, upon layering, an air layer may be formed between the sheet layers or an adhesive which is thermally non-conductive is used, inevitably deteriorating heat dissipation performance.

Also to minimize the inner air gap of the expanded graphite sheet, in the process of compacting the expanded graphite sheet, the expanded graphite may be filled with dense amorphous nano-carbon or graphite particulate powder as a filler so as to suit the thickness of the sheet and then be compacted.

Typical graphite has a theoretical density of about 2.28 g/cm$^3$, and the density of an expanded graphite layer formed via conventional roller compaction using such graphite is 0.8~1.25 g/cm$^3$, from which the air gap that makes up about 45~65% of the theoretical density of typical graphite can be seen to have been left behind in the graphite sheet.

Such amorphous carbon particles may increase the density of a compacted body in the roller compaction process, thereby increasing heat diffusion and thermal conductivity. The amorphous carbon particles may decrease the presence of air gap which makes up 45~65% of the theoretical density to 15~55%, and thermal conductivity may be controlled depending on the density.

The particle size of the dense amorphous nano-carbon or the graphite particulate powder is not particularly limited, but is preferably set to 10~110 nm. When the amorphous carbon particles having such a size are used, heat dissipation effects may be maximized. Upon compacting graphite, such particles may easily penetrate between graphite particles. Furthermore, dense amorphous nano-carbon is mixed in an amount of 5~30 wt % based on the total amount of expanded graphite and then roller compacted, whereby the amount of air gap is decreased and thus the density of the sheet may be increased to 1.0~2.0 g/cm$^3$. Ultimately, the graphite sheet has a thermal conductivity of 400~1900 W/mK in a horizontal direction and 3 W/mK~20 W/mK in a vertical direction, thus drastically improving heat dissipation from the rear surface and heat diffusion from the horizontal surface.

Below is a description of the structure of the expanded graphite sheet according to the present invention.

The expanded graphite sheet according to the present invention allows heat generated from the tops of a variety of integrated circuits of a circuit board of an electronic product, a light source of a display device, etc. to directly and indirectly come into contact with a panel and a case, thus providing a heat diffusion and heat dissipation solution.

The expanded graphite sheet according to the present invention includes an expanded graphite layer, and a support film formed on at least one surface of the expanded graphite layer. The support film is a polymer film selected from among PET, PE and PI or a metal film. The metal film is formed of a material such as aluminum, copper, etc. The support film includes an adhesive layer on at least one surface thereof. The adhesive layer which is interposed between the expanded graphite layer and the support film functions to bind the expanded graphite and the support film. In particular, the support film may include an adhesive layer on the surface made in contact with the electronic part. The adhesive layer and the polymer film are resistant to heat up to 80~180° C. so that they do not become thermally denatured.

The graphite sheet according to the present invention may include a release sheet which will be removed from the support film upon usage. The thickness of the release sheet is preferably 30~130 μm. The density of the expanded graphite layer is preferably 0.8~2.0 g/cm$^3$.

The expanded graphite sheet according to the present invention has superior anisotropic thermal and electrical conduction, heat resistance and corrosion resistance, a low friction coefficient, and good self-lubricating properties, and accepts neutrons, and may endure extended irradiation with beta- and gamma-rays. Also, this sheet is flexible and may thus be easily compressed and is made bendable, and has a restoration rate of 9% or more after compression. When this sheet is mounted so as to be compressed upon fabrication of an LED illuminator, liquid or gas does not penetrate therein.

With reference to Table 1 below, the inner temperature of the LED backlight using the expanded graphite sheet of the example of the invention is lower than that of the LED backlight of the comparative example which does not use the expanded graphite sheet. This means that the sheet of the invention is effective at diffusing heat. Thus, the sheet of the invention may be inexpensively manufactured and is very superior in terms of heat diffusion efficiency compared to the other products.

TABLE 1

| | Sample | Applied Voltage (volt) | Current (mA) | Temperature (° C.) |
|---|---|---|---|---|
| Comp. Ex. | use of general PCB | 8 | 513 | 55.2 |
| | use of metal PCB | 8 | 482 | 51.8 |
| Ex. | use of metal PCB and expanded graphite sheet | 8 | 392 | 44.7 |

Figure 2:
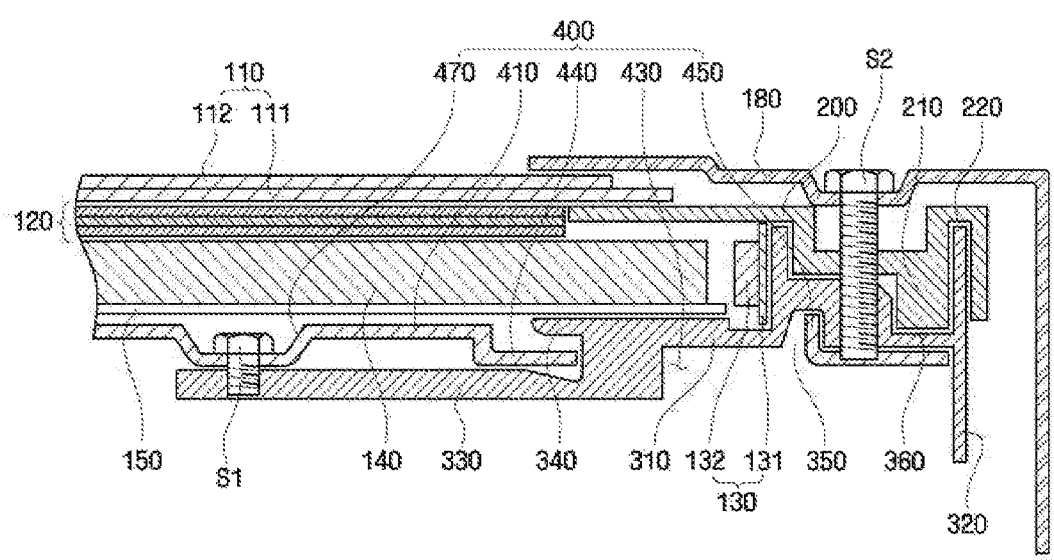
FIG. 2 is a cross-sectional view illustrating the display device of FIG. 1 taken along the line A-A'.

With reference to FIGS. 1 to 8, the backlight assembly and the display device according to the present invention are described below. FIG. 1 is an exploded perspective view illustrating the display device according to an embodiment of the invention, and FIG. 2 is a cross-sectional view illustrating the display device of FIG. 1 taken along the line A-A'.

The display device 1 includes a display panel assembly 120 for displaying an image and a backlight assembly 10 for supplying light to the display panel assembly 120.

The display panel assembly 120 displays an image using light supplied from the backlight assembly 10. The display panel assembly 120 may have any panel structure so long as it is able to display an image using light supplied from the backlight assembly 10, and a liquid crystal display panel is illustratively described herein but the present invention is not limited thereto.

The display panel assembly 120 includes a display panel comprising a first substrate 111, a second substrate 112, and polarizer plates 113, 114 disposed on the surfaces thereof, liquid crystals (not shown), a gate driving unit 116, a flexible film 117 and a printed circuit board 118.

The display panel 110 comprises a first substrate 111 including a gate line (not shown), a data line (not shown) and a pixel electrode or the like, a second substrate 112 disposed to face the first substrate 111 and including a black matrix, a color filter and a common electrode or the like, and a polarizer plate 113 disposed below the first substrate 111 and a polarizer plate 114 disposed on the second substrate 112. The color filter or the common electrode may be provided on the first substrate 11 depending on the kind of display panel 110.

The display panel 110 formed by layering the above-mentioned substrates in flat panel form is disposed on a middle frame 200 which will be described later.

The backlight assembly 10 includes a light source unit 130, a light guide plate 140, an optical sheet 120, a middle frame 200, an upper housing 180, a reflective sheet 150, a lower housing 400, and an LED fixing frame 300.

The light source unit 130 is configured such that a plurality of point light sources 132 is disposed on a circuit board 131, and may be provided on the side surfaces of the light guide plate 140. The point light sources 132 may be for example an LED light source. The circuit board 131 may be for example a printed circuit board (PCB) or a metal PCB. Such a light source unit 130 may be provided on at least one side surface of the light guide plate 140, as necessary. Specifically, the light source unit 130 may be formed on one side surface, both side surfaces, or all of four side surfaces of the light guide plate 140 in consideration of the size, brightness uniformity and so on of the display panel 110.

In the case where the body of the light source unit 130 is made of a metal plate, this module circuit board is configured such that an insulating layer is formed on the upper surface thereof, and an electrode line which supplies power to respective light emitting diodes is formed in a predetermined pattern on the insulating layer, and parts which drive the light emitting diodes may be mounted on the electrode line.

The light source unit 130 may couple the LED fixing frame 300 to the lower housing 400 in order to rapidly dissipate heat. Fixing the light source unit 130 to the LED fixing frame 300 may be variously conducted using screws, hooks, etc.

An example of coupling the light source unit 130 and the LED fixing frame 300 will be specified later.

The light guide plate 140 uniformly supplies light to the display panel 110 from the light source unit 130. The light guide plate 140 includes the light source unit 130 disposed on at least one side thereof, and is accommodated in the lower housing 400. The light guide plate 140 may be provided in the form of for example a rectangular panel such as the display panel 110. However, the present invention is not limited thereto, and when the point light sources 132 such as LEDs are used, this plate may be formed in any pattern including predetermined grooves or protrusions depending on the positions of the point light sources 132.

For the sake of using a single word, the light guide plate 140 may be described as a plate, but it may actually be provided in the form of a sheet or a film to accomplish slimness of the display device 1. That is, the light guide plate 140 is to be understood as being a concept that includes not only a plate but also a film which guides the light.

The light guide plate 140 may be formed of a transparent material so as to efficiently guide light, for example, an acrylic resin such as polymethylmethacrylate (PMMA), polycarbonate (PC), etc.

At least one surface of the light guide plate 140 may be formed with a pattern. For example, the lower surface thereof may be formed with a scattering pattern (not shown) so as to emit the guided light upwards.

The optical sheet 120 is disposed on the light guide plate 140 so that light transferred from the light guide plate 140 is diffused and collected. The optical sheet 120 may include a diffusive sheet, a prism sheet, a protective sheet, etc. The diffusive sheet disperses light received from the light guide plate 140 so as to prevent the partial concentration of light. The prism sheet may be configured such that prisms having a triangular column shape are formed in a predetermined array on one surface thereof, and this prism sheet is disposed on the diffusive sheet and thus functions to collect light diffused from the diffusive sheet in a direction perpendicular to the display panel 110. The protective sheet may be formed on the prism sheet, and plays a role in protecting the surface of the prism sheet and diffusing light to uniformly distribute light.

The middle frame 200 is coupled to the lower housing 400, and the optical sheet 120, the light guide plate 140, the light source unit 130, the reflective sheet 150 and the LED fixing frame 300 are interposed between the middle frame 200 and the lower housing 400. The middle frame 200 is formed along the edge of the lower housing 400, and thus includes an open window which exposes the optical sheet 120 at the center thereof.

Also provided on the middle frame 200 is the display panel 110. Such a middle frame 200 may be formed of a flexible material such as a plastic material, in order to prevent damaging the display panel 110.

The reflective sheet 150 is disposed between the light guide plate 140 and the lower housing 400, so that light emitted below the light guide plate 140 is reflected toward the display panel 110 to increase light efficiency.

The reflective sheet 150 may be formed of for example polyethyleneterephthalate (PET) so as to be imparted with reflectivity, and its one surface may be coated with a diffusion layer containing titanium dioxide. On the other hand, the reflective sheet 150 may be formed of a material containing a metal such as Ag.

The lower housing 400 may be formed of a metal material having rigidity such as stainless steel or a material having good heat dissipation properties such as aluminum or aluminum alloys. The lower housing 400 of the present embodiment is responsible for maintaining the framework of the display device 1 and protecting a variety of components accommodated therein.

The LED fixing frame 300 is disposed at one side of the lower housing 400, so that heat generated from the light source unit 130 is rapidly emitted to the outside of the lower housing 400. The LED fixing frame 300 may perform a function of retaining the framework of the display device 1 by being coupled to the lower housing 400, as well as the heat dissipation function.

At least a part of the LED fixing frame 300 is exposed through one side of the lower housing 400, and thus heat transferred from the light source unit 130 may be rapidly emitted to the outside of the display device 1 (more particularly the outside of the lower housing 400).

The specific shapes and the coupling relations of the lower housing 400, the middle frame 200 and the LED fixing frame 300 will be described in detail later with reference to the drawings.

The upper housing 180 is coupled to the middle frame 200 and the lower housing 400 so as to cover the display panel 110 placed on the middle frame 200. The center of the upper housing 180 is formed with an open window which exposes the display panel 110.

The upper housing 180 may be connected to the middle frame 200 and the lower housing 400 using hooks and/or screws. The upper housing 180 and the lower housing 400 may be coupled to each other via a variety of methods other than those mentioned above.

Figure 3:
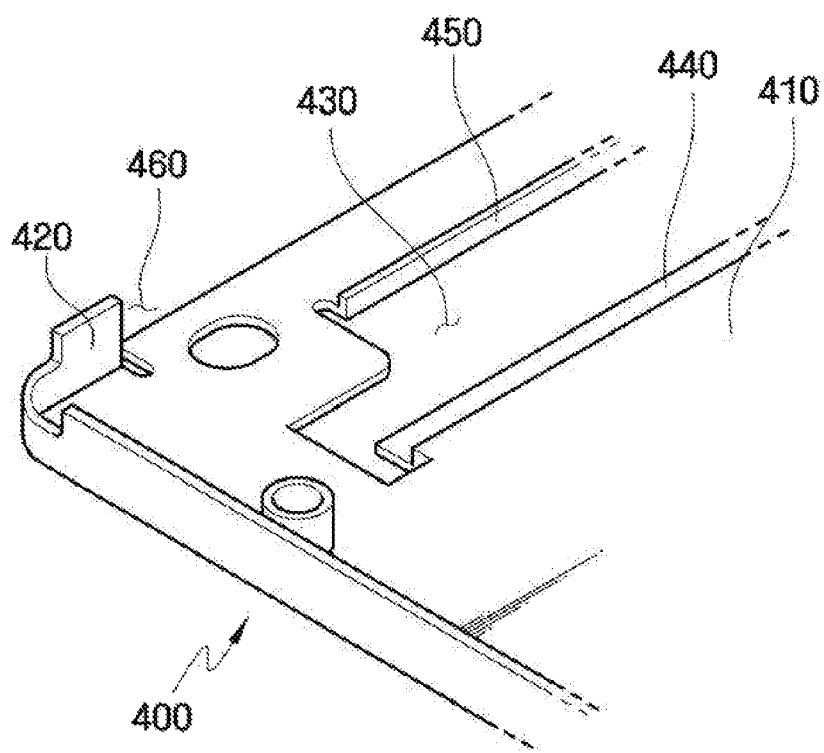
FIG. 3 is a partial perspective view illustrating a lower housing included in the display device of FIG. 1.
Figure 4:
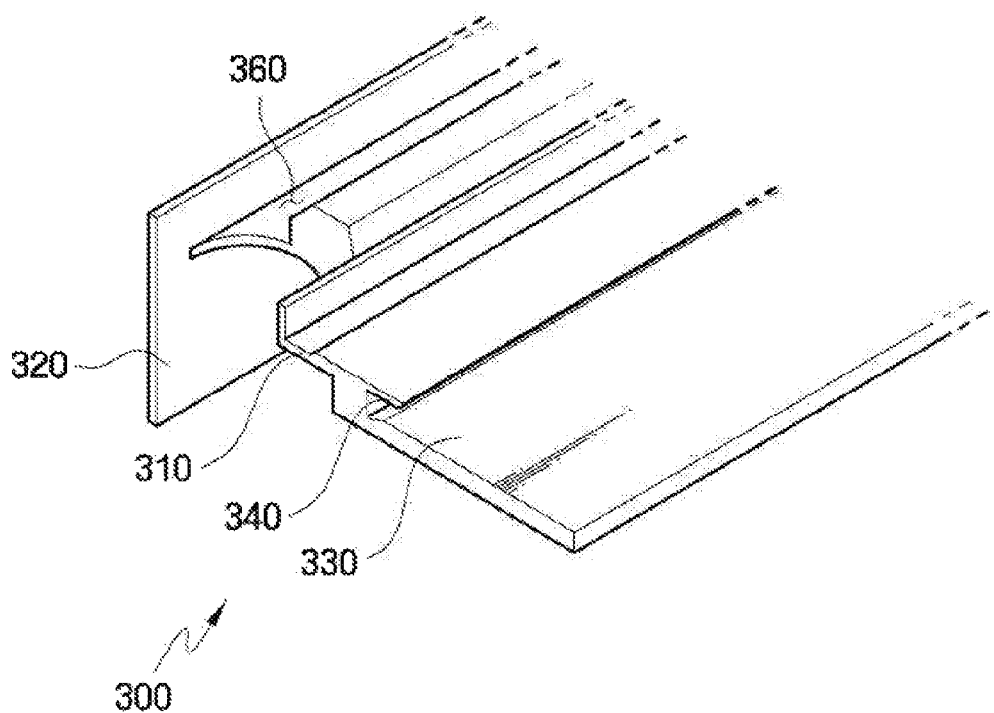
FIG. 4 is a partial perspective view illustrating an LED fixing frame included in the display device of FIG. 1.
Figure 5:
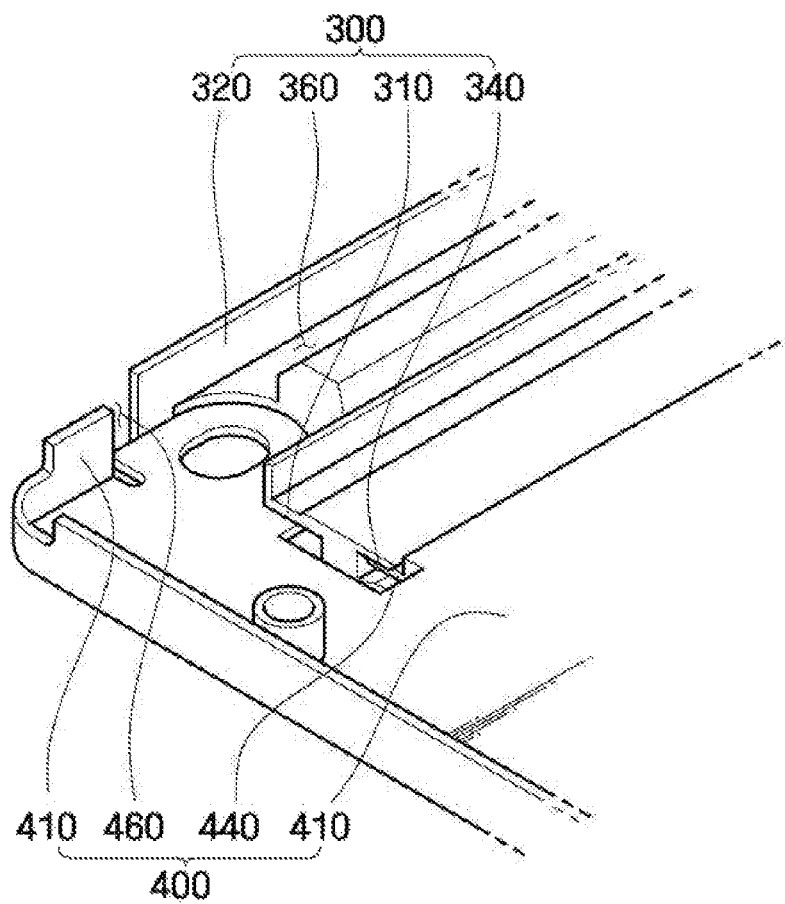
FIG. 5 is a partial perspective view illustrating the lower housing of FIG. 3 and the LED fixing frame of FIG. 4 which are coupled to each other.
Figure 6:
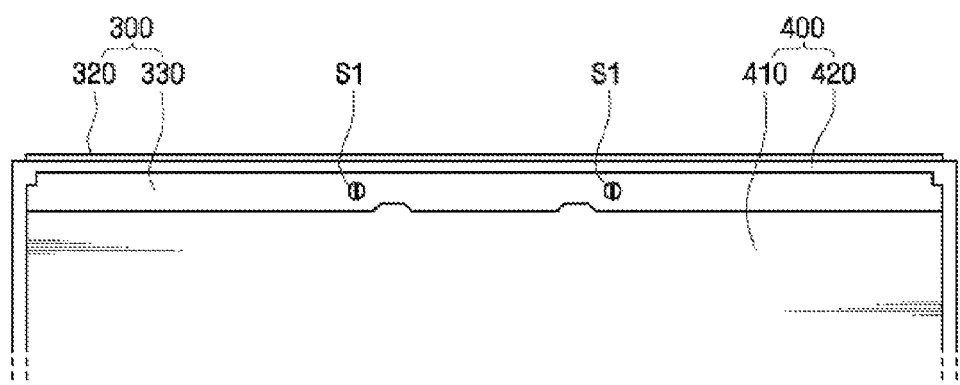
FIG. 6 is a partial plan view illustrating the lower housing of FIG. 3 and the LED fixing frame of FIG. 4 which are coupled to each other.

The following is a description of the specific structure of the lower housing 400 and the LED fixing frame 300, referring to FIGS. 2 to 6. FIG. 3 is a partial perspective view illustrating the lower housing included in the display device of FIG. 1, FIG. 4 is a partial perspective view illustrating the LED fixing frame included in the display device of FIG. 1, FIG. 5 is a partial perspective view illustrating the lower housing of FIG. 3 and the LED fixing frame of FIG. 4, which are coupled to each other, and FIG. 6 is a partial plan view illustrating the lower housing of FIG. 3 and the LED fixing frame of FIG. 4, which are coupled to each other.

As illustrated in FIGS. 2 and 3, the lower housing 400 includes a bottom portion 410 and sidewall portions 420 around the periphery of the bottom portion 410.

The lower housing 400 accommodates the light guide plate 140 and the light source unit 130, and functions to keep up rigidity of the display device 1, and the bottom portion 410 and the sidewall portions 420 may be selectively formed. That is, if the rigidity of the display device 1 is determined to be kept up sufficiently, part or all of the bottom portion 410 and the sidewall portions 420 may be removed. For example, in the case where the rigidity may be sufficiently kept up by the middle frame 200 or the upper housing 180 which is coupled to the lower housing 400, only the bottom portion 410 may be provided.

The lower housing 400 includes first apertures 430 and second apertures 460, and thus a part of the LED fixing frame 300 may be exposed to the outside of the lower housing 400. As illustrated in FIG. 2, the exposed LED fixing frame 300 may be covered with the upper housing 180, or may be screened by a case of the display device and thus may not be visible from the outside. Each of the first apertures 430 may be formed by cutting at least a part of the bottom portion 410, and each of the second apertures 460 may be formed by cutting at least a part of each of the sidewall portions 420. As such, the first apertures 430 may be formed by perforating some regions of the bottom portion 410, and thus may be provided in the form of a closed space in which the sides of the first apertures 430 are connected, and the second apertures 460 may be formed by removing some regions of the sidewall portions 420, and may be provided in the form of an open space in which the sides of the second apertures 460 are not connected.

The positions and the shapes of the first apertures 430 and the second apertures 460 are not limited thereto, and may be variously modified, as necessary.

The first apertures 430 may be formed longitudinally in the extension direction of the light source unit 130 and the sidewall portions 420. The first apertures 430 may be formed longitudinally in for example a rectangular shape, or may be divided into a plurality of sections.

The lower housing 400 may include a bent portion so that the LED fixing frame 300 may be coupled to at least one of the sides of the first apertures 430. Concretely, the lower housing 400 includes a first bent portion 440 formed on one side of the first aperture 430 and a second bent portion 450 formed on the other side thereof.

The first bent portion 440 and the second bent portion 450 may be used to fix the LED fixing frame 300 in a direction perpendicular to the bottom portion 410 and a direction horizontal to the bottom portion 410, respectively.

The first bent portion 440 is formed by bending a portion of the bottom portion 410 adjacent to the first aperture 430, and the cross-section of the first bent portion 440 may be "L"-shaped. The first bent portion 440 may extend parallel to the bottom portion 410, and may thus be inserted between an extension portion 330 and a fixing protrusion 340 of the LED fixing frame 300, which will be described later. The first bent portion 440 may be continuously formed along the abutment portion of the LED fixing frame 300, or may be discontinuously formed along the abutment portion of the LED fixing frame 300.

The second bent portion 450 is formed by bending a portion of the bottom portion 410, which is adjacent to the first aperture 430. The second bent portion 450 is bent perpendicular to the bottom portion 410, and the cross-section thereof may be "L"-shaped. That is, the second bent portion 450 protrudes from the bottom portion 410 in a direction perpendicular to the bottom portion 410 and is inserted into a first fixing groove 350 of the LED fixing frame 300, which will be described later. The second bent portion 450 may be continuously or discontinuously formed along the abutment portion of the LED fixing frame 300.

The second apertures 460 may be formed by cutting at least a part of the sidewall portions 420, and an end of the LED fixing frame 300 may be exposed through the second aperture 460. The second aperture 460 may be formed not only by cutting an end of the sidewall portion 420, but also by removing the entire sidewall portion 420. That is, each of the second apertures may have any shape so long as it is formed by removing at least a part of the sidewall portions 420 to expose the LED fixing frame 300.

As illustrated in FIGS. 2 and 4, the LED fixing frame 300 includes a horizontal portion 310 positioned inside the lower housing 400, and an extension portion 330 and a vertical portion 320 which are exposed to the outside of the lower housing 400.

The horizontal portion 310 is disposed parallel to the bottom portion 410 of the lower housing 400, and both ends of the horizontal portion 310 are connected to the vertical portion 320 and the extension portion 330. The vertical portion 320 extends from an end of the horizontal portion 310 in a direction perpendicular to the horizontal portion 310, and is exposed to the outside of the lower housing 400 through the second apertures 460. As such, the horizontal portion 310 and the vertical portion 320 are terms used for the sake of expression, and it is not essential that the horizontal portion 310 and the vertical portion 320 be orthogonal to each other, and the vertical portion 320 may have any shape so long as it extends from the horizontal portion 310 and may be exposed through the second apertures 460.

The vertical portion 320 may be formed parallel to the sidewall portions 420 of the lower housing 400, and the vertical portion 320 may be formed so as to further extend to a position lower than the bottom portion 410 of the lower housing 400. The area of the vertical portion 320 may be appropriately set to generate the desired heat dissipation effect.

The extension portion 330 extends from an end of the horizontal portion 310 of the LED fixing frame 300 in a direction horizontal to the bottom portion 410. The extension portion 330 is exposed to the outside of the lower housing 400 through the first apertures 430, and extends so as to overlap at least a part of the bottom portion 410.

The extension portion 330 overlaps the bottom portion 410, so that the LED fixing frame 300 is supported to the lower housing 400 and thus fixed thereto. The fixing of the LED fixing frame 300 and the lower housing 400 will be described later.

An end of the horizontal portion 310 is provided with a fixing protrusion 340 that extends parallel to the extension portion 330. The fixing protrusion 340 is used to fix the LED fixing frame 300 to the lower housing 400, and the first bent portion 440 of the lower housing 400 is inserted between the fixing protrusion 340 and the extension portion 330.

The fixing protrusion 340 is spaced apart from the extension portion 330 so that the first bent portion 440 of the lower housing 400 can be inserted between the fixing protrusion 340 and the extension portion 330. The fixing protrusion 340 may be continuously or discontinuously formed along the extension portion 330.

On the other hand, the LED fixing frame 300 includes a first fixing groove 350 and a second fixing groove 360 into which the second bent portion 450 of the lower housing 400 and the protrusion portion 210 of the middle frame 200 are inserted.

The first fixing groove 350 may be provided in recessed form so that the second bent portion 450 of the lower housing 400 may be inserted therein, and is recessed in a direction parallel to the vertical portion 320 so that the second bent portion 450 is fixed in a direction horizontal to the bottom portion 410.

The second fixing groove 360 is also provided in recessed form so that the protrusion portion 210 of the middle frame 200 is inserted therein. The first fixing groove 350 and the second fixing groove 360 may be continuously or discontinuously formed along the sidewall portions 420 of the lower housing 400, and the sizes and the positions of the first fixing groove 350 and the second fixing groove 360 may vary, as necessary.

The LED fixing frame 300 may be made of a metal having high thermal conductivity such as Al, and may be formed using a variety of processes, such as extrusion, sheet metal making, etc.

Referring to FIGS. 2, 5 and 6, the coupling structure of the lower housing 400 and the LED fixing frame 300 is specifically described.

The LED fixing frame 300 is fixed to an end of the lower housing 400. As such, the extension portion 330 and the vertical portion 320 of the LED fixing frame 300 are exposed to the outside of the lower housing 400 through the first aperture 430 and the second aperture 460, respectively.

In particular, the extension portion 330 protrudes from the outside of the lower housing 400 via the first aperture 430, and extends to overlap at least a part of the bottom portion 410. As such, the first bent portion 440 of the lower housing 400 is inserted between the fixing protrusion 340 which protrudes parallel to the extension portion 330 and the extension portion 330. In this way, the LED fixing frame 300 is fixed in a direction perpendicular to the lower housing 400. The first aperture 430 may expose a part of the horizontal portion 310 of the LED fixing frame 300.

On the other hand, the second bent portion 450 of the lower housing 400 is inserted into the first fixing groove 350 of the LED fixing frame 300, so that the LED fixing frame 300 is fixed in a direction perpendicular to the lower housing 400.

The vertical portion 320 of the LED fixing frame 300 is exposed to the outside of the lower housing 400 through the second aperture 460, and the vertical portion 320 extends to a position lower than the bottom portion 410 so as to enhance the ability to horizontally couple the LED fixing frame 300 and the lower housing 400.

Even when the LED fixing frame 300 is exposed to the outside of the lower housing 400, the height of the protruding vertical portion 320 of the LED fixing frame 300 may be equal to or less than that of a fixing wall 315 of the LED fixing frame which supports the circuit board 131, so as not to increase the thickness of the entire module.

The LED fixing frame 300 may be coupled to the lower housing 400 using screws. As such, the extension portion 330 of the LED fixing frame 300 may be coupled to the bottom portion 410 of the lower housing 400 by screws S1.

The LED fixing frame 300 does not have to be coupled to the lower housing 400 only by screws, and they may be connected by welding or caulking.

Figure 7:
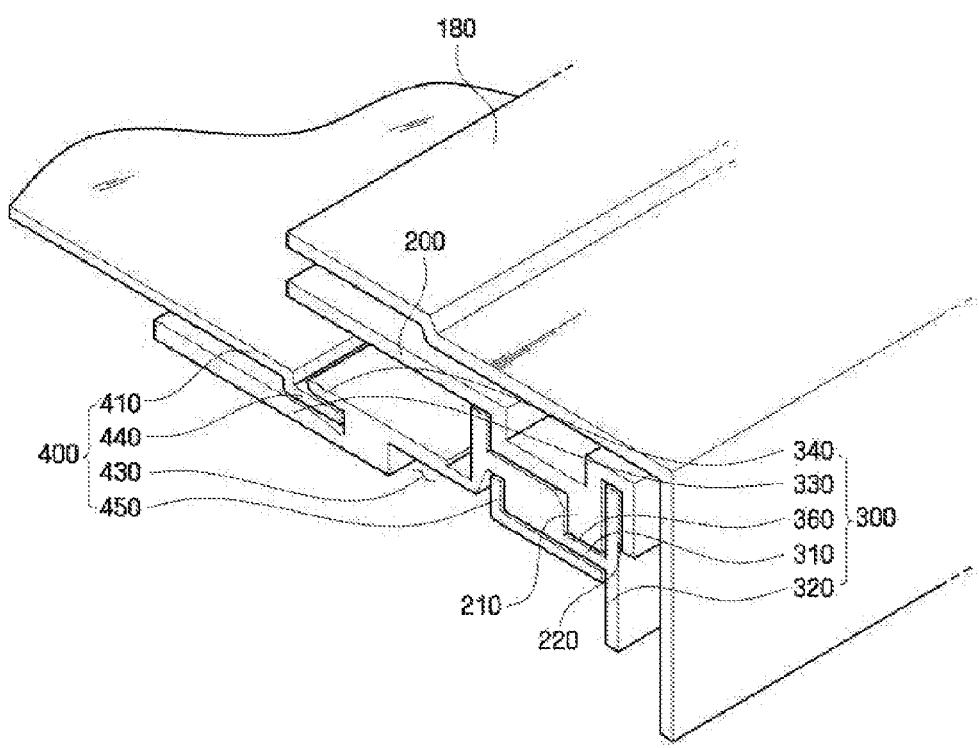
FIG. 7 is a partially cut perspective view illustrating the lower housing, a middle frame, the LED fixing frame and an upper housing included in the display device of FIG. 1.

Referring to FIG. 7, the coupling relations of the upper housing 180, the middle frame 200, the lower housing 400 and the LED fixing frame 300 will be specifically described. FIG. 7 is a partially cut perspective view illustrating the lower housing, the middle frame, the LED fixing frame and the upper housing included in the display device of FIG. 1.

The middle frame 200 is provided onto the lower housing 400 and the LED fixing frame 300. As such, an end of the middle frame 200 is inserted into the second fixing groove 360 of the LED fixing frame 300, and a part of the vertical portion 320 of the LED fixing frame 300 is inserted into the insertion groove 220 of the middle frame 200. That is, the LED fixing frame 300 and the middle frame 200 are engaged with each other.

The display panel 110 is provided on the middle frame 200, and the upper housing 180 is provided on the display panel. The upper housing 180 may be coupled to the lower housing 400 using screws S2. The screws S2 are coupled to the lower housing 400 by passing through the middle frame 200 and the LED fixing frame 300 starting from the upper housing 180.

Meanwhile, the lower housing 400 and the LED fixing frame 300 are coupled using the screws S1 as mentioned above. As such, the screw S1 may be fastened into a protrusion portion 470 formed by protruding a part of the bottom portion 410 outwards.

FIGS. 2 and 8 to 10 show an example of coupling using hooks, wherein a groove is formed on the lower surface of the circuit board 131 and a dovetail protrusion is formed on the LED fixing frame 300.

The LED fixing frame 300 not only supports the liquid crystal display panel 110 and the light source unit 130 but also fixes the circuit board 131. Also, the LED fixing frame 300 may be further provided with heat dissipation means 80 for emitting heat generated from the LED.

Figure 8:
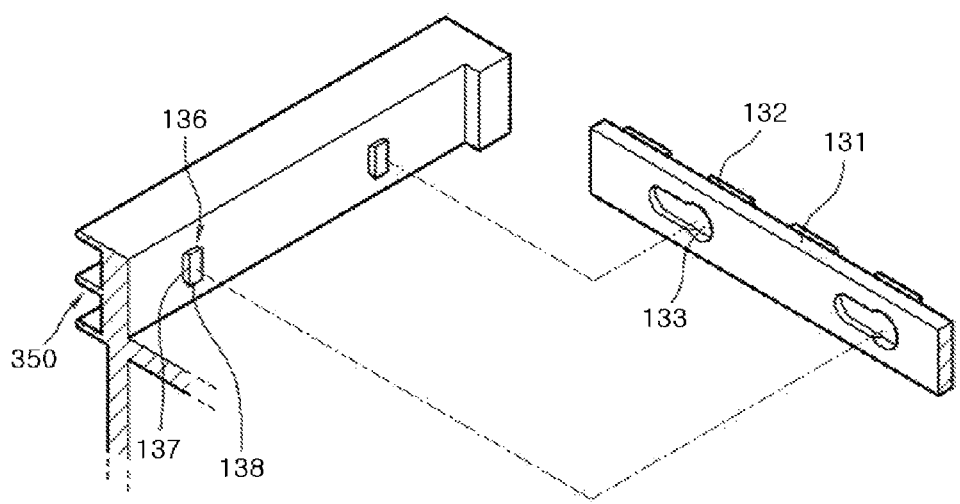
FIG. 8 is an exploded perspective view illustrating a circuit board and a fixing frame which are coupled to each other.
Figure 9:
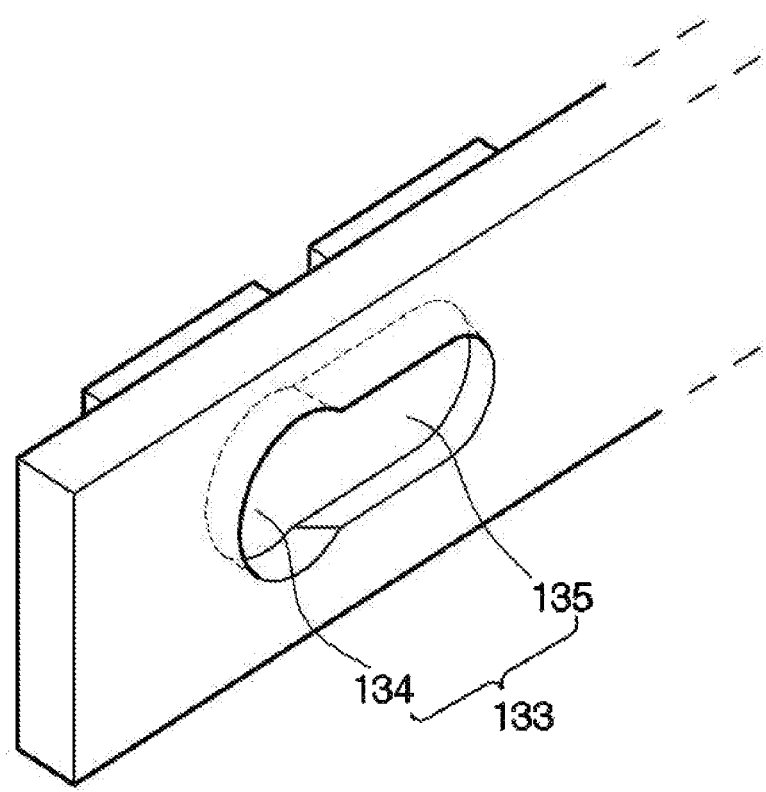
FIG. 9 is a perspective view illustrating the coupling groove of the circuit board.
Figure 10:
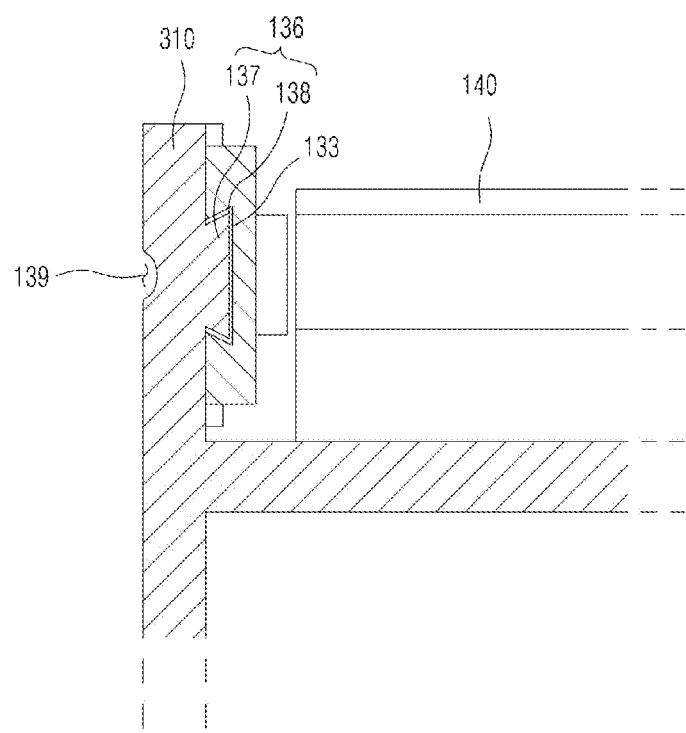
FIG. 10 is a cross-sectional view illustrating the circuit board and the fixing frame which are coupled to each other.

As illustrated in FIGS. 8 to 10, a coupling groove 133 is formed in a longitudinal direction on the rear surface of the circuit board 131, and a coupling member 136 is formed on the horizontal portion 310 of the LED fixing frame 300 which is coupled to the circuit board 131, in order to be fitted into the coupling groove 133.

The coupling member 136 includes a protrusion portion 137 which protrudes from one surface of the horizontal portion 310 of the LED fixing frame 300, and a coupling protrusion 138 extending from at least one side of the protrusion portion 137.

The coupling member 136 may be formed by cutting the LED fixing frame 300. In this case, however, the member may be lost and the cutting is difficult to perform, undesirably increasing the manufacturing cost. Thus, a mold (not shown) is provided to shape the coupling member 136 on one surface of the horizontal portion 310, and the other surface of the horizontal portion 310 is punched, whereby the coupling member 136 may be formed on one surface of the horizontal portion 310. Accordingly, the other side of the horizontal portion 310 may be provided with a depression portion 139 at a position corresponding to the coupling member 136.

The coupling groove 133 includes an insertion portion 134 into which the coupling member 136 is inserted on the rear surface of the circuit board 131, and a coupling groove portion 135 which extends from the insertion portion 134 in an extension direction of the circuit board 131 so that the protrusion portion 137 of the coupling member 136 is caught therein.

The cross-section of the coupling groove 133 and the coupling member 136 which are mutually coupled may have any one shape selected from among a dovetail shape, a truncated triangular shape, a circular shape, a T shape, a lozenge shape, and a trapezoidal shape.

As illustrated in FIG. 10, the protrusion portion 137 and the coupling protrusion 138 of the coupling member 136 have a dovetail shape. In the case where the cross-section of the coupling member 136 has a dovetail shape, the coupling protrusion 138 may have a taper structure at the upper side thereof. In the drawing, the upper surface of the coupling protrusion 138 is seen to have a rectangular shape, but the upper surface of the coupling protrusion 138 may have a circular shape. Also, the upper surface of the coupling member 136 is flat as illustrated in cross-section, but may be curved in some embodiments. The cross-section of the coupling protrusion 138 of the coupling member 136 may have a circular shape or a circular shape a part of which is linearly cut. The width of the cross-section of the coupling protrusion 138 is larger than that of the protrusion portion 137. Furthermore, the width of the upper surface of the coupling protrusion 138 belongs to the inner width range of the coupling groove 133 and may be equal to any one thereof.

On the other hand, the inner surface of the coupling groove portion 135 of the coupling groove 133 has a taper structure so as to be connected with the coupling member 136. Accordingly, the coupling groove portion 135 is very narrowly exposed to the rear surface of the circuit board 131, and becomes wide toward the inside of the circuit board 131.

In contrast, the insertion portion 134 does not have a taper structure because the coupling member 136 is merely inserted and does not need to be connected therewith. The width of the insertion portion 134 is larger than that of the coupling protrusion 138 of the coupling member 136 in order to facilitate the insertion of the coupling member 136. The size of the upper surface of the coupling member 136, namely, of the coupling protrusion 138, is smaller than or equal to the widest portion of the coupling groove portion 135 and is larger than the narrowest portion thereof. Also, the narrowest portion of the coupling groove portion 135 is equal to or larger than the protrusion portion 137 of the coupling member 136.

The coupling member 136 is inserted into the insertion portion 134, and may slide in the extension direction of the circuit board 131, that is, in the extension direction of the coupling groove portion 135 and thus is connected with the coupling groove portion 135.

The coupling member 136 is provided to the horizontal portion 310 of the LED fixing frame 300, and the coupling groove 133 is formed on the circuit board 131, but the present invention is not limited thereto. The coupling member 136 may be formed on the circuit board 131, and the coupling groove 133 may be formed on the horizontal portion 310 of the LED fixing frame 300. To this end, a mold (not shown) is provided on one surface of the circuit board 131 to shape the coupling member 136, and the other surface of the circuit board 131 is punched, and thus the coupling member 136 may be formed on one surface of the circuit board 131. Thus, the other surface of the circuit board 131 may have a depression portion 139 at a position corresponding to the coupling member 136.

Meanwhile, when the light source unit 130 and the LED fixing frame 300 are connected using hooks or screws, a gap of about 10~200 μm is formed between the light source unit 130 and the LED fixing frame 300 by a precision processing operation, and thus heat transfer does not take place very well.

Accordingly, in order to rapidly transfer heat generated by the light source unit 130, the light source unit 130 preferably includes a graphite sheet 500 or a thermally conductive adhesive layer having high thermal conductivity between the circuit board 131 and the LED fixing frame 300.

The kind of adhesive polymer resin of the thermally conductive adhesive layer is not particularly limited, and any resin usable as the adhesive in the art may be utilized. For example, an adhesive polymer resin, such as a silicone based resin, an acrylic resin, a urethane based resin, etc., may be used, and particularly useful is an acrylic resin.

Concretely, an example of the acrylic resin may include a polymer resulting from copolymerizing a (meth)acrylic acid ester based monomer having a C1~12 alkyl group with a polar monomer copolymerizable with this monomer.

The non-limiting examples of the (meth)acrylic acid ester based monomer include butyl (meth)acrylate, hexyl (meth)

acrylate, n-octyl (meth)acrylate, iso-octyl (meth)acrylate, 2-ethylhexyl (meth)acrylate, isononyl (meth)acrylate, etc.

The non-limiting examples of the polar monomer copolymerizable with the (meth)acrylic acid ester based monomer include carboxylic group-containing monomers, such as (meth)acrylic acid, maleic acid, fumaric acid, etc., or nitrogen-containing monomers such as acrylamide, N-vinylpyrrolidone, N-vinylcaprolactam, etc. This polar monomer imparts cohesion to the adhesive layer and enhances the adhesive force.

In the adhesive polymer resin, the weight ratio of the (meth)acrylic acid ester based monomer to the polar monomer is not particularly limited, but may fall in the range of 99~80:1~20. In this range, the acrylic resin may exhibit the adhesive force that is required of the adhesive layer.

Examples of a thermally conductive filler usable in the invention include metal oxide, metal hydroxide, metal nitride, metal carbide, boron compounds, graphite, etc., and specifically $Al(OH)_3$, graphite, BN, $Al_2O_3$, silicon carbide, sendust (Al 6 wt %~Si 9 wt %~Fe 85 wt %), etc., which may be used in combination. The kind of thermally conductive filler is not limited thereto. Particularly in the case of graphite, it may exhibit superior plane diffusion properties due to its structural features to thus ensure good plane heat transfer effects, and thereby the case where such graphite may be mixed with another thermally conductive filler may manifest excellent performance. The adhesive layer may include 3~60 wt % of graphite, and preferably includes 3~40 wt % of graphite to increase the adhesive force.

Figure 11:
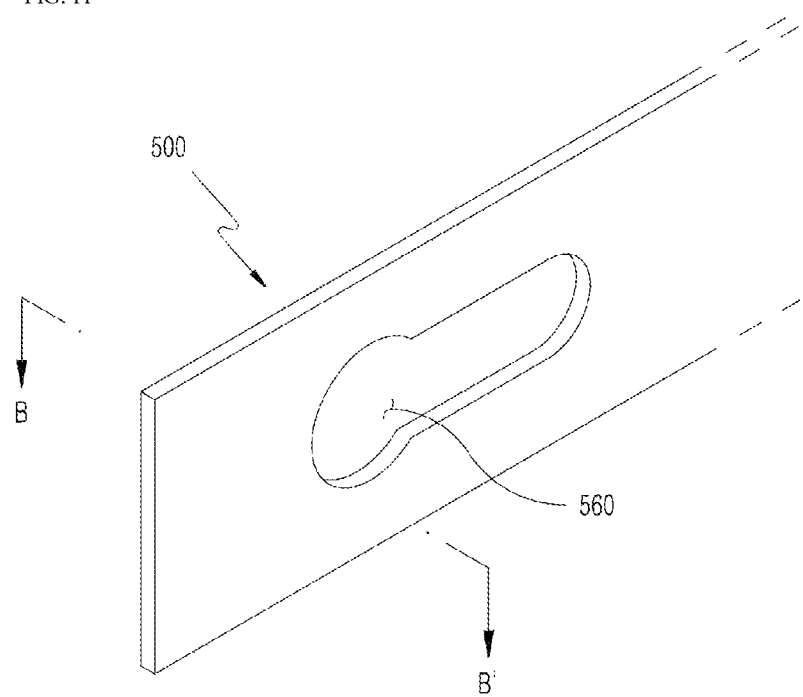
FIG. 11 is a perspective view illustrating a graphite sheet.
Figure 12:
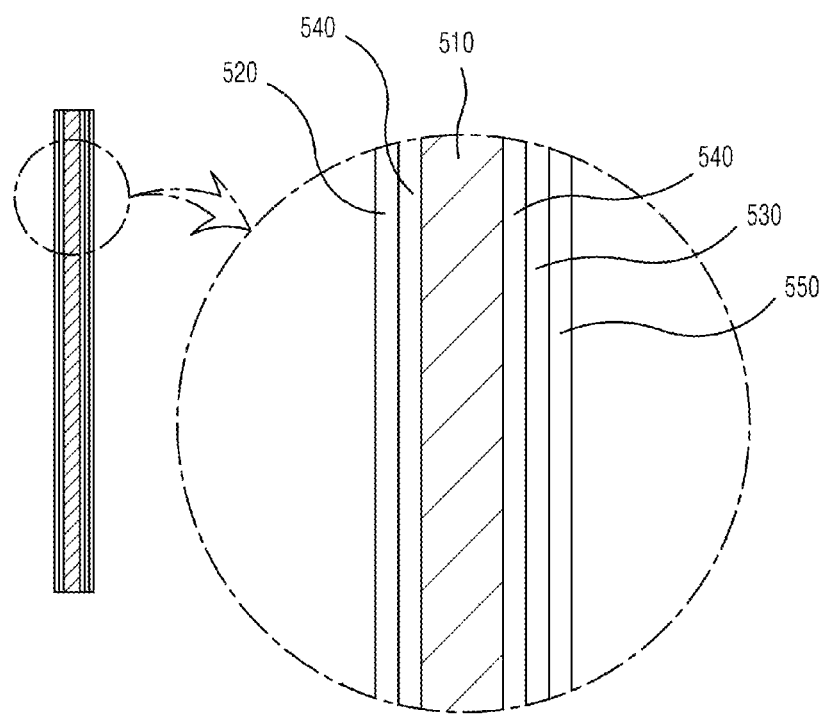
FIG. 12 is a cross-sectional view illustrating the graphite sheet taken along the line B-B'.

As illustrated in FIGS. 11 and 12, the graphite sheet 500 includes a graphite layer 510, and support films 520, 530 formed on at least one surface of the graphite layer 510, and the support films 520, 530 include adhesive layers 540, 550 on at least one surface thereof. The support films 520, 530 may be a polymer film selected from among PET, PE and PI, or a metal film. The metal film is preferably for example a film containing aluminum, copper or the like. The adhesive layer 540 disposed between the expanded graphite layer 510 and the support films 520, 530 functions to bind the graphite layer 510 to the support films 520, 530.

The thickness of the support films 520, 530 is preferably between 5 and 50 μm.

The adhesive layers 540, 550 may be formed using a typical adhesive, but are preferably obtained using an adhesive composed of the thermally conductive polymer resin as specified above.

The adhesive layers 540, 550 preferably have a thickness of 2~20 μm.

The adhesive layer 550 disposed between the circuit board 131 or the LED fixing frame 300 and the support films 520, 530 functions to fix the graphite sheet 500 to the LED fixing frame 300. As such, the graphite sheet 500 may include a through hole 560 having the same shape as that made in the coupling groove 133.

The graphite sheet 500 preferably has a thickness of about 10~200 an so as to fill the gap between the light source unit 130 and the LED fixing frame 300.

In the structure wherein the coupling groove 133 and the coupling member 136 are connected with each other as shown in FIGS. 8 to 10, the coupling member 136 is connected in a sliding manner into the coupling groove 133. Thus, in order not to prevent sliding due to the adhesive force of the adhesive layer 550, the graphite sheet 500 positioned between the circuit board 131 and the LED fixing frame 300 may have the adhesive layer 550 formed only on any one of the polymer films 520, 530. Thereby, the adhesive layer 550 formed on any one of the polymer films 520, 530 of the graphite sheet 500 may fix the graphite sheet 500 to either the circuit board 131 or the horizontal portion 310 of the LED fixing frame 300.

Although the edge type backlight assembly and the display device including the same are described as above, they may be applied to a direct-type backlight assembly and a display device including the same. The direct-type backlight assembly and a display device including the same are described below.

In the case of the direct-type backlight assembly, the lower housing and the LED fixing frame are integrated to reduce the thickness thereof, so that the lower housing performs the function of the LED fixing frame. That is, it is preferred that the circuit board be directly connected to the lower housing and a thermally conductive adhesive layer or a graphite sheet be disposed between the circuit board and the lower housing.

As described hereinbefore, the present invention provides a backlight assembly and a display device including the same. According to the present invention, the backlight assembly is configured such that a thermally conductive adhesive or a graphite sheet is disposed between a circuit board and a fixing frame to enhance a force of coupling between the circuit board and the fixing frame, so that the fixing frame and the circuit board are coupled to each other, thus improving coupling reliability and heat dissipation performance and enabling slimness of the display device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A backlight assembly, comprising:
   a circuit board on which light emitting diodes are provided in a predetermined pattern;
   a fixing frame for fixing the circuit board; and
   a thermally conductive adhesive layer disposed between the circuit board and the fixing frame,
   wherein the thermally conductive adhesive layer comprises a polymer resin composed of any one selected from among a silicone based resin, an acrylic resin and a urethane based resin, and a filler composed of any one selected from among metal oxide, metal hydroxide, metal nitride, metal carbide, a boron compound and graphite.

2. The backlight assembly of claim 1, wherein the acrylic resin is a polymer resulting from copolymerizing any one (meth)acrylic acid ester based monomer selected from among butyl (meth)acrylate, hexyl (meth)acrylate, n-octyl (meth) acrylate, iso-octyl (meth)acrylate, 2-ethylhexyl (meth)acrylate, and isononyl (meth)acrylate, having a C1~12 alkyl group; and any one polar monomer copolymerizable with the monomer, selected from among carboxylic group-containing monomers including (meth)acrylic acid, maleic acid, and fumaric acid, and monomers including acrylamide, N-vinylpyrrolidone, and N-vinylcaprolactam.

3. The backlight assembly of claim 2, wherein the (meth) acrylic acid ester based monomer and the polar monomer have a weight ratio of 99~80:1~20.

4. The backlight assembly of claim 2, wherein the graphite is used in an amount of 3~40 wt %.

5. The backlight assembly of claim 1, further comprising:
   a coupling member disposed on any one of the circuit board and the fixing frame; and
   a coupling groove formed on the other one of the circuit board and the fixing frame.

6. The backlight assembly of claim 5, wherein the coupling member comprises:
   a protrusion portion; and
   a coupling protrusion extending from at least one side of the protrusion portion, and
   the coupling groove comprises:
   an insertion portion into which the coupling member is inserted so as to be connected therewith; and
   a coupling groove portion extending from the insertion portion in an extension direction of the circuit board so that the coupling member is connected in a sliding manner.

7. The backlight assembly of claim 5, wherein the one of the circuit board and the fixing frame further includes a depression portion at a position corresponding to the coupling member.

8. The backlight assembly of claim 6, wherein a width of the coupling protrusion is greater than a width of the protrusion portion, and a width of the insertion portion is greater than the width of the coupling protrusion.

9. The backlight assembly of claim 8, wherein the protrusion portion is equal to or less than a narrowest portion of the coupling groove portion.

10. The backlight assembly of claim 1, further comprising a housing for accommodating the fixing frame and having an aperture, and a part of the fixing frame is exposed to outside of the housing through the aperture.

11. A display device, comprising:
   a display panel for displaying an image;
   a circuit board on which light emitting diodes are provided in a predetermined pattern;
   a fixing frame for fixing the circuit board; and
   a graphite sheet disposed between the circuit board and the fixing frame,
   wherein the graphite sheet comprises a graphite layer having a density of 1.0~2.0 g/cm$^3$, a support film formed on at least one surface of the graphite layer, and an adhesive layer applied on at least one surface of the support film, and the graphite sheet has a thermal conductivity of 400~1900 W/mK in a horizontal direction and 3~20 W/mK in a vertical direction.

12. The display device of claim 11, wherein the support film is a polymer film selected from among PET, PE and PI or a metal film.

\* \* \* \* \*